(12) United States Patent
Hayashi et al.

(10) Patent No.: US 8,642,410 B2
(45) Date of Patent: Feb. 4, 2014

(54) METHOD FOR MANUFACTURING SEMICONDUCTOR DEVICE AND METHOD FOR GROWING GRAPHENE

(71) Applicant: Fujitsu Limited, Kawasaki (JP)

(72) Inventors: Kenjiro Hayashi, Ushiku (JP); Shintaro Sato, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/756,815

(22) Filed: Feb. 1, 2013

(65) Prior Publication Data
US 2013/0143374 A1    Jun. 6, 2013

Related U.S. Application Data

(63) Continuation of application No. PCT/JP2010/063250, filed on Aug. 5, 2010.

(51) Int. Cl.
*H01L 21/84*  (2006.01)
*H01L 21/00*  (2006.01)

(52) U.S. Cl.
USPC .................. 438/157; 977/936; 257/E51.038

(58) Field of Classification Search
USPC .................................................. 438/153–283
See application file for complete search history.

(56) References Cited

U.S. PATENT DOCUMENTS

| | | | |
|---|---|---|---|
| 5,863,601 A | 1/1999 | Kikuchi | |
| 7,181,958 B2* | 2/2007 | Schlaf | 73/105 |
| 2004/0018139 A1* | 1/2004 | Mancevski | 423/447.3 |
| 2006/0057388 A1* | 3/2006 | Jin et al. | 428/408 |
| 2007/0096616 A1* | 5/2007 | Han et al. | 313/309 |
| 2009/0221130 A1 | 9/2009 | Asano | |
| 2009/0320991 A1* | 12/2009 | Boyle et al. | 156/151 |
| 2009/0325452 A1* | 12/2009 | Nakano et al. | 445/50 |
| 2010/0132771 A1* | 6/2010 | Lu | 136/252 |
| 2011/0001175 A1* | 1/2011 | Jang | 257/296 |
| 2012/0132534 A1* | 5/2012 | Das | 205/333 |
| 2013/0146846 A1* | 6/2013 | Adkisson et al. | 257/27 |
| 2013/0146847 A1* | 6/2013 | Adkisson et al. | 257/29 |

FOREIGN PATENT DOCUMENTS

| | | |
|---|---|---|
| EP | 0 732 421 A1 | 9/1996 |
| JP | H7-2508 | 1/1995 |
| JP | H8-260150 | 10/1996 |
| JP | H9-31757 | 2/1997 |
| JP | 2009-164432 A1 | 7/2009 |
| WO | WO 2008/023669 A1 | 2/2008 |

OTHER PUBLICATIONS

"Catalyst patterned growth of interconnecting graphene layer on SiO2/Si substrate for integrated devices" Yun-Hi Lee and Jong-Hee Lee Citation: Appl. Phys. Lett. 95, 143102 (2009); doi: 10.1063/1.3240403.*

"Transfer-free Fabrication of Suspended Graphene Grown by Chemical Vapor Deposition" N. Lindvall, J. Sun and A. Yurgens Department of Microtechnology and Nanoscience, Chalmers University of Technology, Gothenburg, Sweden.*

M. Kusunoki, et al.; "A formation mechanism of carbon nanotube films on SiC(0001);" Applied Physics Letters; vol. 77, No. 4; Jul. 24, 2000; pp. 531-533 and cover sheet (4 Sheets)/p. 2 of specification.

(Continued)

*Primary Examiner* — Seahvosh Nikmanesh
*Assistant Examiner* — Evren Seven
(74) *Attorney, Agent, or Firm* — Kratz, Quintos & Hanson, LLP

(57) ABSTRACT

A catalyst film (2) is formed over a substrate (1). A graphene (3) is grown on the catalyst film (2). A gap through which a lower surface of the catalyst film (2) is exposed is formed. The catalyst film (2) is removed through the gap.

9 Claims, 19 Drawing Sheets

(56) References Cited

OTHER PUBLICATIONS

M. Lemme, et al.; "A Graphene Field-Effect Device;" IEEE Electron Device Letters; vol. 28; No. 4; Apr. 2007; pp. 282-284 (3 Sheets)/p. 2 of specification.

International Search Report for International Application No. PCT/JP2010/063250 dated Oct. 26, 2010.

International Preliminary Report on Patentability mailed Apr. 25, 2013 in counterpart application No. PCT/JP2010/063250 (7 pages).

* cited by examiner

METHOD FOR MANUFACTURING SEMICONDUCTOR DEVICE AND METHOD FOR GROWING GRAPHENE

CROSS-REFERENCE TO RELATED APPLICATION

This application is a continuation application of International Application PCT/JP2010/063250 filed on Aug. 5, 2010 and designated the U.S., the entire contents of which are incorporated herein by reference.

FIELD

The present invention relates to a method for manufacturing a semiconductor device and a method for growing a graphene.

BACKGROUND

A graphene recently attracts attention as a material of a channel of a field-effect transistor. Further, the graphene also attracts attention as a material of a wiring of a semiconductor device. This is because the graphene has electron mobility higher than silicon by several digits and also has high current density resistance. Thus, a method for manufacturing a semiconductor device which includes a channel and/or a wiring where the graphene is partly used is variously studied.

For example, there is known a method in which a graphene is stripped off from graphite with an adhesive tape or the like and is attached to a desired position. However, it is quite difficult to manufacture a minute semiconductor device by this method. Further, such a processing requires a great deal of time.

Further, there is also a method in which a graphene is fabricated by subliming silicon from a silicon carbide (SIC) substrate. However, since sublimation of silicon requires application of heat of 1200° C. or more, such a method cannot be adopted for manufacturing a semiconductor device which includes a silicon oxide film and so on.

Further, there is also known a method in which a graphene is grown on a catalytic metal by a chemical vapor deposition method or the like. However, since the catalytic metal being a conductor and the graphene are in contact in this method, the graphene cannot be used as a channel.

Patent Literature 1: Japanese Laid-open Patent Publication No. 7-2508
Patent Literature 2: Japanese Laid-open Patent Publication No. 8-260150
Patent Literature 3: Japanese Laid-open Patent Publication No. 9-31757
Non Patent LITERATURE 1: Appl. Phys. Lett. 77 (2000) 531
Non Patent LITERATURE 2: IEEE Electron Device Lett. 28, 282 (2007)

SUMMARY

In an embodiment of a method for manufacturing a semiconductor device, a catalyst film is formed over a substrate, and a graphene is grown on the catalyst film. Further, a gap is formed through which a lower surface of the catalyst film is exposed, and the catalyst film is removed through the gap.

In another embodiment of a method for manufacturing a semiconductor device, a catalyst film is formed over a substrate, a protective film is formed through which an upper surface of the catalyst film is exposed, and a graphene is grown on the upper surface of the catalyst film.

Incidentally, a graphene may be a base unit of graphite and the graphite may be composed of graphenes stacked on each other.

The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Referential Example

First, a referential example will be described. FIG. 1A to FIG. 1G are cross-sectional views illustrating the referential example of a method for manufacturing a semiconductor device, in sequence of processes.

Figure 1A:
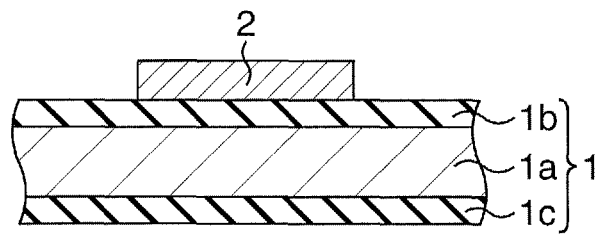
FIG. 1A is a cross-sectional view illustrating a referential example of a method for manufacturing a semiconductor device.
Figure 1B:
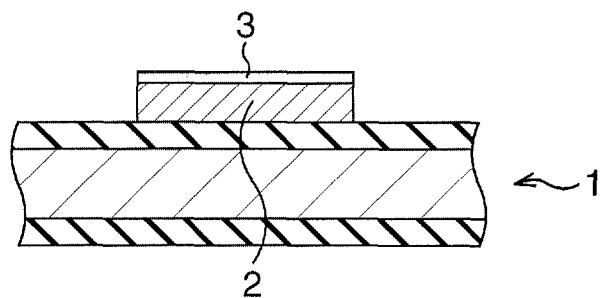
FIG. 1B, continued from FIG. 1A, is a cross-sectional view illustrating the referential example.
Figure 1C:
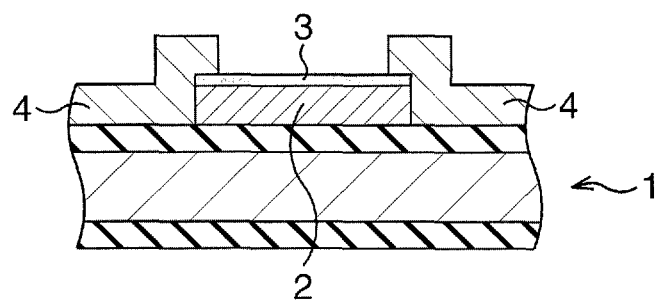
FIG. 1C, continued from FIG. 1B, is a cross-sectional view illustrating the referential example.
Figure 1D:
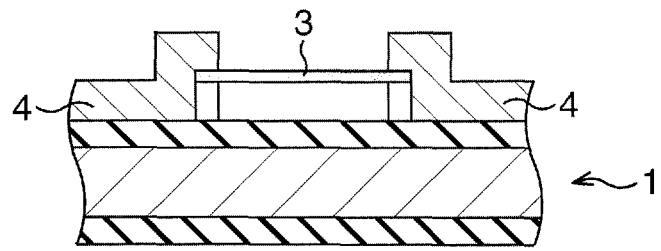
FIG. 1D, continued from FIG. 1C, is a cross-sectional view illustrating the referential example.
Figure 1E:
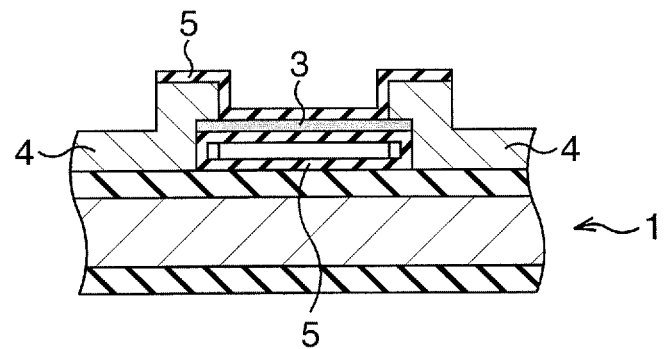
FIG. 1E, continued from FIG. 1D, is a cross-sectional view illustrating the referential example.
Figure 1F:
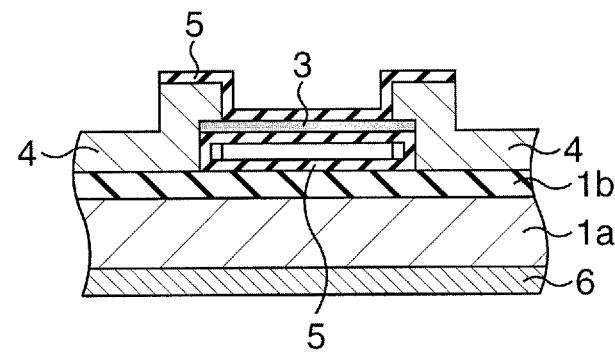
FIG. 1F, continued from FIG. 1E, is a cross-sectional view illustrating the referential example.

First, as illustrated in FIG. 1A, a catalyst film 2 is formed on a substrate 1. Then, as illustrated in FIG. 1B, a graphene 3 is formed on the catalyst film 2. Thereafter, as illustrated in FIG. 1C, two electrodes 4 which cover end portions of the graphene 3 are formed on a silicon oxide film 1b. Subsequently, as illustrated in FIG. 1D, the catalyst film 2 is removed. Since both end portions of the graphene 3 are held by the electrodes 4 from sides, the graphene 3 is suspended between the electrodes 4. Then, as illustrated in FIG. 1E, an insulation film 5 which covers an exposed surface of the graphene 3 is formed. Thereafter, as illustrated in FIG. 1F, the silicon oxide film 1c is removed. Subsequently, a back gate electrode 6 is formed on a rear surface of a silicon layer 1a.

Figure 1G:
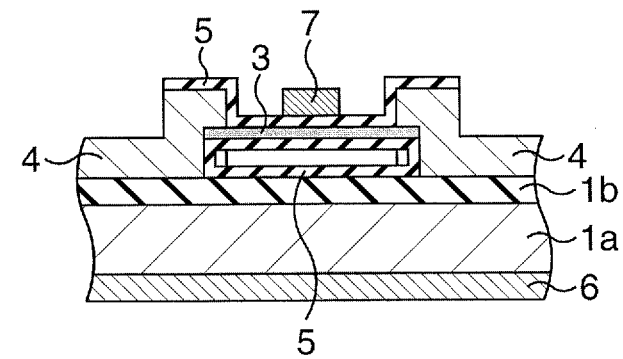
FIG. 1G, continued from FIG. 1F, is a cross-sectional view illustrating the referential example.

Subsequently, as illustrated in FIG. 1G, a gate electrode 7 is formed on a part of the insulation film 5, the part covering an upper surface of the graphene 3.

In the semiconductor device manufactured as above, a Fermi level of the graphene 3 changes in correspondence with an electric potential of the back gate electrode 6 and an electric potential of the gate electrode 7. Further, the graphene 3 is covered with the insulation film 5 and a path of an electric current flowing between the two electrodes 4 is the graphene 3 only. Therefore, the graphene 3 functions as a channel and the two electrodes 4 function as a source electrode and a drain electrode. Incidentally, in order to make a field effect by a gate voltage work effectively, it is preferable that the number of graphene layers included in the graphene 3 is about 1 to 10.

In this manufacturing method, though the graphene 3 is formed on the catalyst film 2, the catalyst film 2 is removed and thus it is possible to make the graphene 3 function as a channel.

Figure 2A:
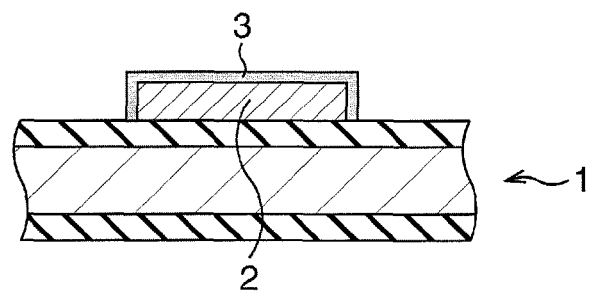
FIG. 2A is a cross-sectional view illustrating a problem which occurs in the referential example.
Figure 2B:
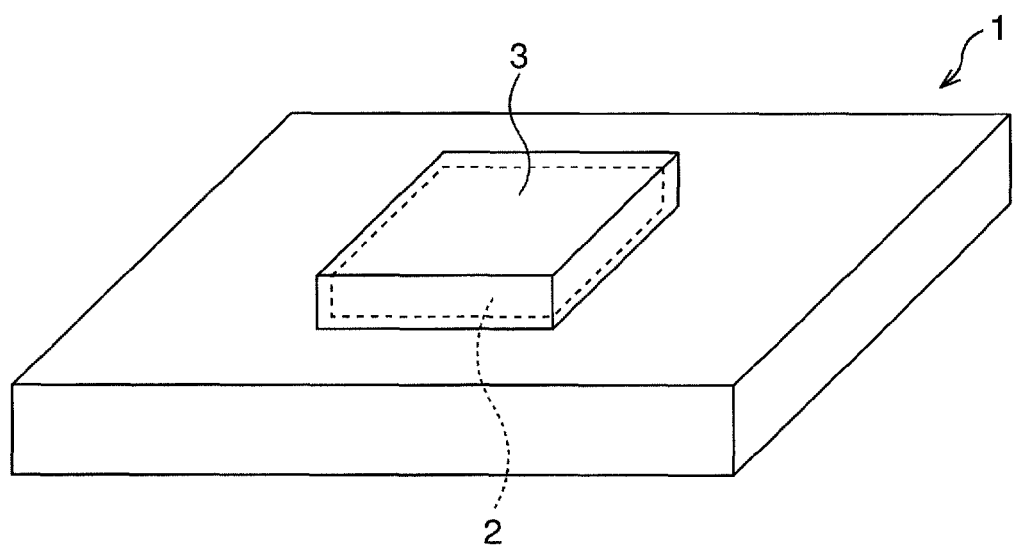
FIG. 2B is a perspective view illustrating the problem which occurs in the referential example.

However, as illustrated in FIG. 2A and FIG. 2B, the graphene 3 sometimes covers side surfaces of the catalyst film 2. In such a case, it is difficult to remove the catalyst film 2 after the electrodes 4 are formed. When the catalyst film 2 remains below the graphene 3, an electric current flowing between the electrodes 4 or the like is influenced. Further, formation of the insulation film 5 is also influenced.

Hereinafter, embodiments are concretely described with reference to the attached drawings. These embodiments enable surer removal of the catalyst film 2.

First Embodiment

First, a first embodiment will be described. FIG. 3A to FIG. 3G are cross-sectional views illustrating a method for manufacturing a semiconductor device according to the first embodiment, in sequence of processes. Further, FIG. 4A to FIG. 4C are perspective views illustrating the method for manufacturing the semiconductor device according to the first embodiment, in sequence of processes.

Figure 3A:
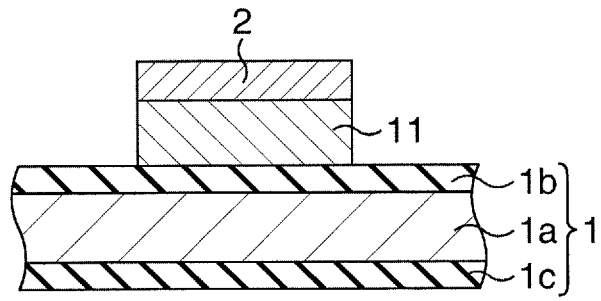
FIG. 3A is a cross-sectional view illustrating a method for manufacturing a semiconductor device according to a first embodiment.
Figure 4A:
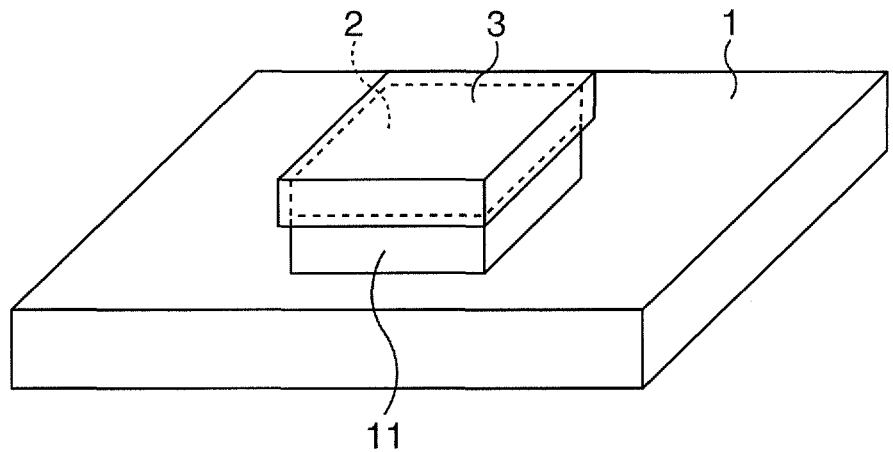
FIG. 4A is a perspective view illustrating the method for manufacturing the semiconductor device according to the first embodiment.
Figure 4B:
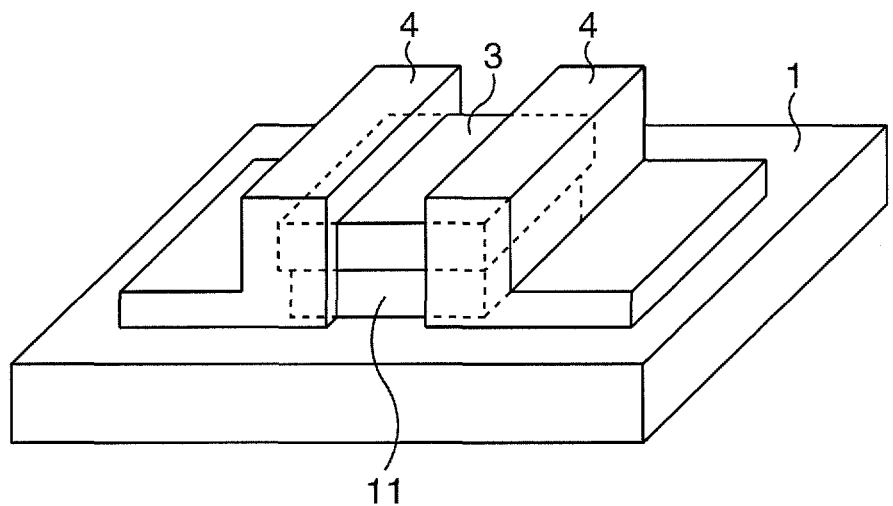
FIG. 4B, continued from FIG. 4A, is a perspective view illustrating the method for manufacturing the semiconductor device.
Figure 4C:
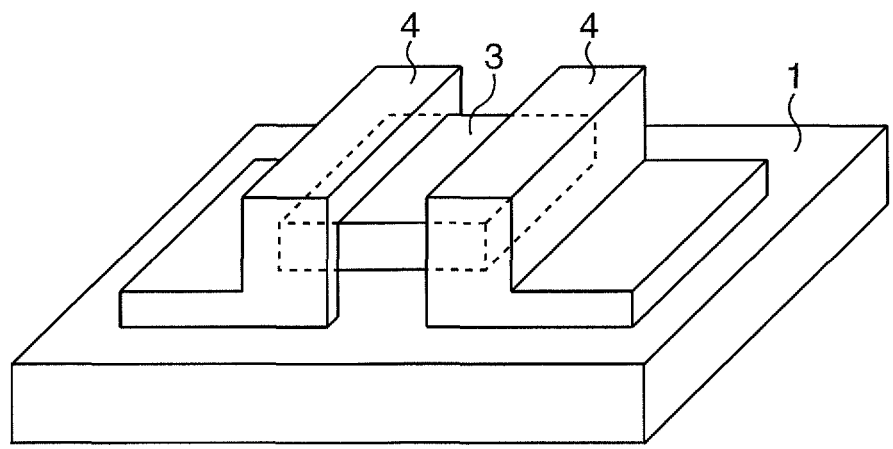
FIG. 4C, continued from FIG. 4B, is a perspective view illustrating the method for manufacturing the semiconductor device.

In the first embodiment, first, as illustrated in FIG. 3A, a base 11 is formed on a substrate 1, and a catalyst film 2 is formed thereon. As the substrate 1, one in which a silicon oxide film 1b is formed on a front surface of a silicon layer 1a and a silicon oxide film 1c is formed on a rear surface, for example, may be used. The silicon oxide films 1b and 1c may be formed by thermal oxidation, for example.

As the catalyst film 2, an iron (Fe) film of a thickness of about 200 nm, for example, is formed by a lift-off method. That is, a resist film which has an opening at a region on which the catalyst film 2 is to be formed is formed on the silicon oxide film 1b, and a catalyst film is deposited by a sputtering method, for example. In forming the resist film, a photolithography technique or an electronic beam lithography technique, for example, may be adopted. Then, the resist film is removed together with the catalyst film thereon. Consequently, the catalyst film 2 remains on the silicon oxide film 1b. A forming condition of the catalyst film by the sputtering method is not limited to a particular one, and an output power may be 100 W and a sputtering rate may be 1 Å/sec, for example. Further, instead of the sputtering method, an electron beam evaporation method or a molecular beam epitaxy (MBE) method may be adapted. As the catalyst film 2, a film of a compound or an alloy containing iron such as an iron oxide (FeO and $Fe_2O_3$), an iron chloride ($Fe_2Cl_3$), and ferrocobalt (CoFe) may be formed. Further, as the catalyst film 2, a film of nickel (Ni), cobalt (Co), platinum (Pt), gold (Au), or copper (Cu) may be formed, and a film of a compound or an alloy containing Ni, Co, Pt, Au, or Cu may be formed. A thickness of the catalyst film 2 is not limited to a particular one, and it is preferable that the thickness is 50 nm to 1000 nm and it is more preferable that the thickness is 100 nm to 500 nm.

A thickness of the base 11 is not limited to a particular one. Further, the base 11 may be formed together with the catalyst film 2 by a lift-off method, for example. That is, after the resist film is formed, a film to be the base 11 and a film to be the catalyst film 2 are formed by a sputtering method, an electron beam evaporation method, an MBE method, or the like, and the resist film may removed together with the films thereon. As a material of the base 11, it is preferable to use one satisfying the following five conditions, for example. (a) Not having a catalyst ability for formation of a graphene 3. (b) Having a melting point equal to or more than a temperature for forming the graphene 3. (c) Hard to be made into carbide. (d) Removable by dissolution or decomposition. (e) Having etching selectivity with the electrode 4.

Figure 3B:
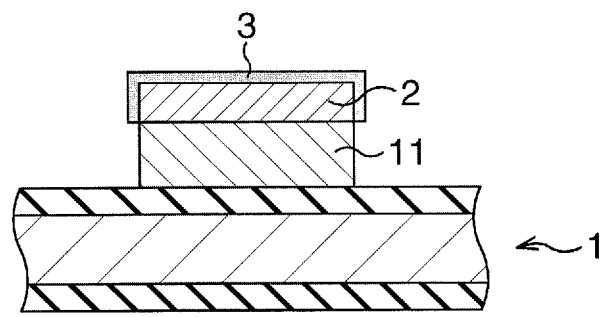
FIG. 3B, continued from FIG. 3A, is a cross-sectional view illustrating the method for manufacturing the semiconductor device.

Then, as illustrated in FIG. 3B and FIG. 4A, the graphene 3 is formed on an upper surface of the catalyst film 2. At this time, even if the graphene 3 is grown on a side surface of the catalyst film 2, the graphene 3 is not grown on the side surface of the base 11, since the base 11 does not function as a catalyst. Formation of the graphene 3 may be performed by a thermal CVD (chemical vapor deposition) method in a vacuum chamber, for example. In this case, a temperature of the substrate 1 may be set to be about 650° C., and a total pressure of mixed gas of acetylene and argon being source gas may be set to be about 1 kPa, for example. A proportion of the partial pressure of acetylene in relation to the total pressure may be about 0.001% to 10%, for example, and it is preferable that the proportion is adjusted in correspondence with a thickness, a growth condition or the like of the graphene 3 to be grown. Further, formation of the graphene 3 may be performed by a hot filament CVD method, a remote plasma CVD method, a plasma CVD method, or the like. Further, as the source gas, hydrocarbon gas such as ethylene, methane, and ethane, or alcohol such as ethanol may be used, and a small amount of oxidation gas such as water and oxygen may be added to the source gas. Further, the temperature of the substrate 1 may be set to 300° C. to 800° C., for example, and it is preferable that the temperature of the substrate 1 is adjusted in correspondence with variety and a thickness of the catalyst film 2 and variety the source gas or the like of. When an Fe film is used as the catalyst film 2 and acetylene is used as the source gas, it is preferable that the temperature of the substrate 1 is about 550° C. to 700° C.

Figure 3C:
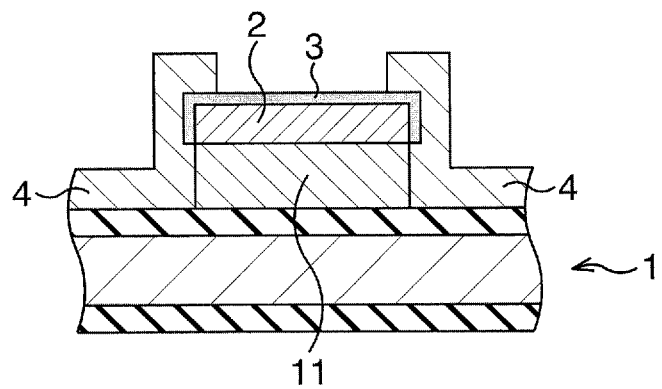
FIG. 3C, continued from FIG. 3B, is a cross-sectional view illustrating the method for manufacturing the semiconductor device.

Thereafter, as illustrated in FIG. 3C and FIG. 4B, two electrodes 4 which cover end portions of the graphene 3 are formed on the silicon oxide film 1b. As the electrode 4, a stacked body of a titanium (Ti) film of a thickness of about 10 nm and an Au film of a thickness of about 200 nm positioned thereon, for example, may be formed by a lift-off method. Incidentally, in forming a resist film, a photolithography technique or an electron beam lithography technique, for example, may be adopted.

Figure 3D:
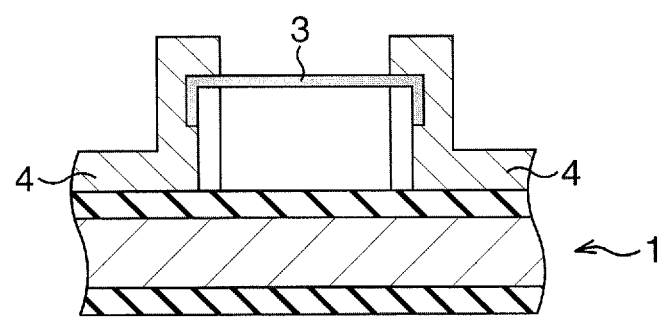
FIG. 3D, continued from FIG. 3C, is a cross-sectional view illustrating the method for manufacturing the semiconductor device.

Subsequently, as illustrated in FIG. 3D and FIG. 4C, the base 11 is removed and the catalyst film 2 is removed. As a result of removal of the base 11, a gap through which a lower surface of the catalyst film 2 is exposed is formed. Since both end portions of the graphene 3 are held by the electrodes 4 from sides, the graphene 3 is suspended between the electrodes 4. Incidentally, the base 11 may be removed by dissolution or decomposition with a solvent or the like corresponding to its material. Further, the catalyst film 2 may be removed by wet processing with hydrochloric acid, aqueous iron chloride solution, fluorine, or the like. When an Fe film of a thickness of about 10 nm to 500 nm is formed as the catalyst film 2, removal of the catalyst 2 may be completed in about 30 minutes with hydrochloric acid of a density of 9 vol %. The base 11 and the catalyst film 2 may be removed collectively depending on materials of the base 11 and the catalyst 2. In the present embodiment, since a gap exists between the graphene 3 and the substrate 1, the whole of the base 11 and the catalyst 2 can be removed easily.

Figure 3E:
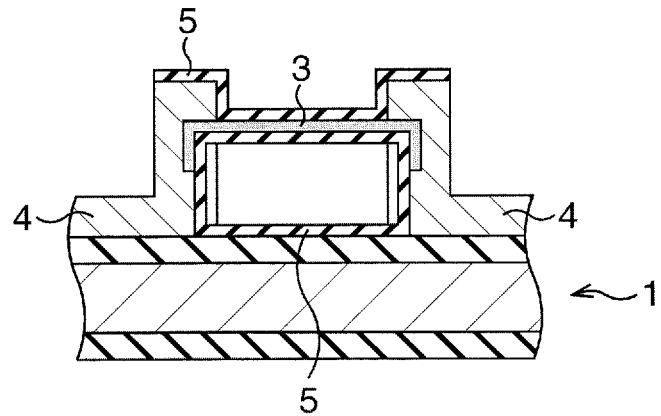
FIG. 3E, continued from FIG. 3D, is a cross-sectional view illustrating the method for manufacturing the semiconductor device.

Then, as illustrated in FIG. 3E, an insulation film 5 which covers an exposed surface of the graphene 3 is formed. When a hafnium oxide or an aluminum oxide is used as a material of the insulation film 5, the insulation film 5 may be deposited in a manner to cover the graphene 3 by an atomic layer deposition method (ALD method), for example. When the hafnium oxide is used as the material of the insulation film 5, the insulation film 5 may be formed at a temperature of 250° C. with tetrakisdimethylamino hafnium (TDMAH) as a raw material, for example. When the aluminum oxide is used as the material of the insulation film 5, the insulation film 5 may be formed at a temperature of 300° C. with trimethylaluminum as a raw material. When a silicon oxide is used as the material of the insulation film 5, the insulation film 5 may be formed by applying SOG (spin on glass) solution by a spin coat method, and annealing at about 500° C. in a nitride atmosphere, for example. A titanium oxide or the like may be also used as the material of the insulation film 5.

Figure 3F:
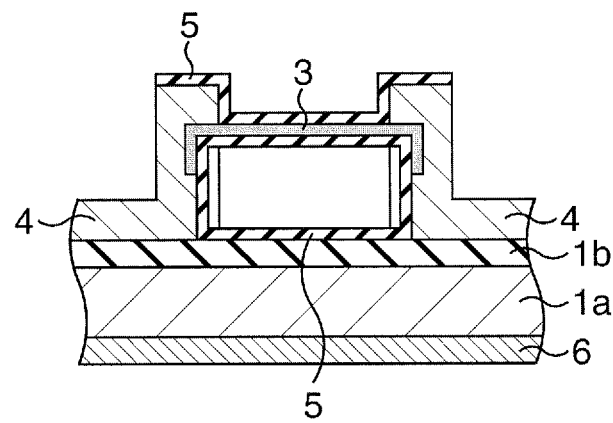
FIG. 3F, continued from FIG. 3E, is a cross-sectional view illustrating the method for manufacturing the semiconductor device.

Thereafter, as illustrated in FIG. 3F, the silicon oxide film 1c is removed. The silicon oxide film 1c may be removed with buffered hydrofluoric acid or the like, with an upper part of the silicon layer 1a being protected by a resist film (for example, "TSMR-V50" of TOKYO OHKA KOGYO CO., LTD.), for example. A processing time thereof may be about 5 minutes. Subsequently, a back gate electrode 6 is formed on a rear surface of the silicon layer 1a. As the back gate electrode 6, a stacked body of a Ti film of a thickness of about 10 nm and an Au film of a thickness of about 100 nm positioned thereon, for example, is formed by an electron beam deposition method.

Figure 3G:
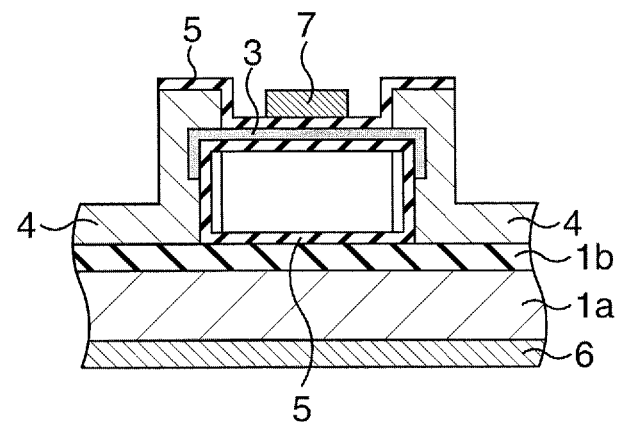
FIG. 3G, continued from FIG. 3F, is a cross-sectional view illustrating the method for manufacturing the semiconductor device.

Then, as illustrated in FIG. 3G, a gate electrode 7 is formed on a part of the insulation film 5, the part covering an upper surface of the graphene 3. The part positioned between the gate electrode 7 and the graphene 3 of the insulation film 5 functions as a gate insulation film. As the gate electrode 7, a stacked body of a Ti film of a thickness of about 10 nm and an Au film of a thickness of about 100 nm positioned thereon, for example, may be formed by a lift-off method. Incidentally, in forming a resist film, a photolithography technique or an electron beam lithography technique, for example, can be adopted. Deposition of the Ti film and the Au film may be performed by an electron beam deposition method, for example.

According to the first embodiment, since the base 11, on a side surface of which the graphene 3 is not grown, is formed between the catalyst film 2 and the substrate 1, even if the graphene 3 covers the side surface of the catalyst film 2, the catalyst film 2 can be easily removed without processing of the graphene 3 or the like. Therefore, the graphene 3 can be surely made to function as a channel.

Here, a concrete example of the material of the base 11 will be described. As the material of the base 11, metals and compounds (oxides, nitrides, carbides, and the like) may be cited. As for the metal, it is preferable to use a transition metal with a high melting point, and Ti, Cr, W, Hf, Nb, and the like are favorable, for example. As for the compound, ZnO, MgO, $Al_2O_3$, $Si_3N_4$, and the like may be cited, for example. Further, regarding the above-described conditions (d) and (e), it is preferable to consider a material of the electrode 4. For example, if the material of the electrode 4 is Ti, it is preferable to select a material which can be removed without usage of hydrofluoric acid, nitric hydrofluoric acid, or heated hydrochloric acid, since Ti is soluble to the solutions. Mo, which is soluble to ammonia, $Al_2O_3$, which is soluble to NaOH, ZnO, which is soluble to almost all the acids and alkaline solutions, and so on may be selected, for example.

Further, if the base 11 is removed by wet etching, it is preferable to use a solvent, considering an ionization tendency. Further, if the base 11 and the catalyst film 2 are removed by wet etching, it is preferable to use a solvent which does not affect the silicon oxide film 1b. That is, since the silicon oxide film 1b is soluble to the hydrofluoric acid, it is preferable to use a solvent other than the hydrofluoric acid. Removal of the base 11 and the catalyst film 2 may be performed by dry etching.

Incidentally, regarding the above-described condition (c), if the base 11 is easy to be made into carbide, the base 11 may be made into carbide during forming the graphene 3, making dissolution and removal of the base 11 difficult.

Incidentally, a hafnium oxide film, an aluminum oxide film or the like may be used instead of the silicon oxide films 1a, 1b.

Second Embodiment

Next, a second embodiment will be described. FIG. 5A to FIG. 5G are cross-sectional views illustrating a method for manufacturing a semiconductor device according to the second embodiment, in sequence of processes. Further, FIG. 6A to FIG. 6B are perspective views illustrating the method for manufacturing the semiconductor device according to the second embodiment, in sequence of processes.

Figure 5A:
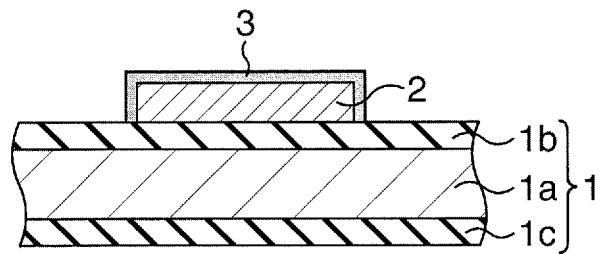
FIG. 5A is a cross-sectional view illustrating a method for manufacturing a semiconductor device according to a second embodiment.

In the second embodiment, first, as illustrated in FIG. 5A, similarly to in the referential example, a catalyst film 2 is formed on a substrate 1. Then, a graphene 3 is formed on an upper surface of the catalyst film 2. At this time, the graphene 3 is sometimes grown on a side surface of the catalyst film 2.

Figure 5B:
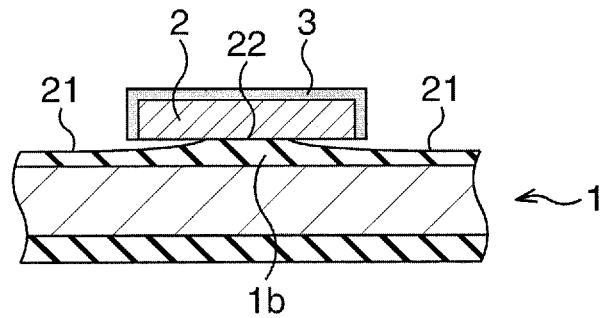
FIG. 5B, continued from FIG. 5A, is a cross-sectional view illustrating the method for manufacturing the semiconductor device.
Figure 6A:
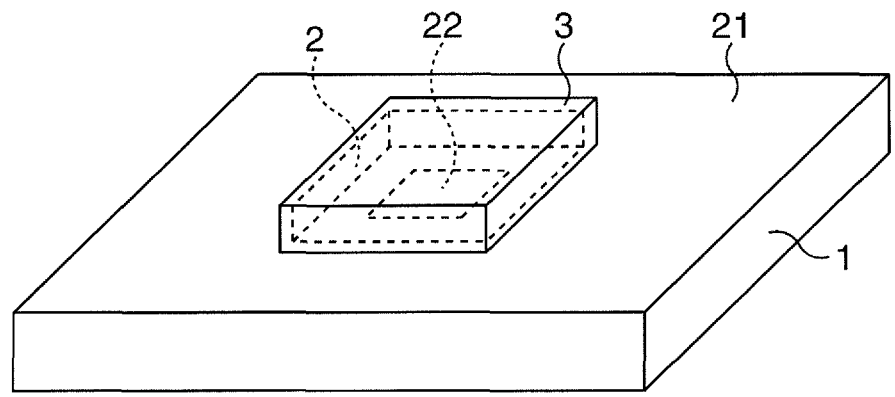
FIG. 6A is a perspective view illustrating the method for manufacturing the semiconductor device according to the second embodiment.
Figure 6B:
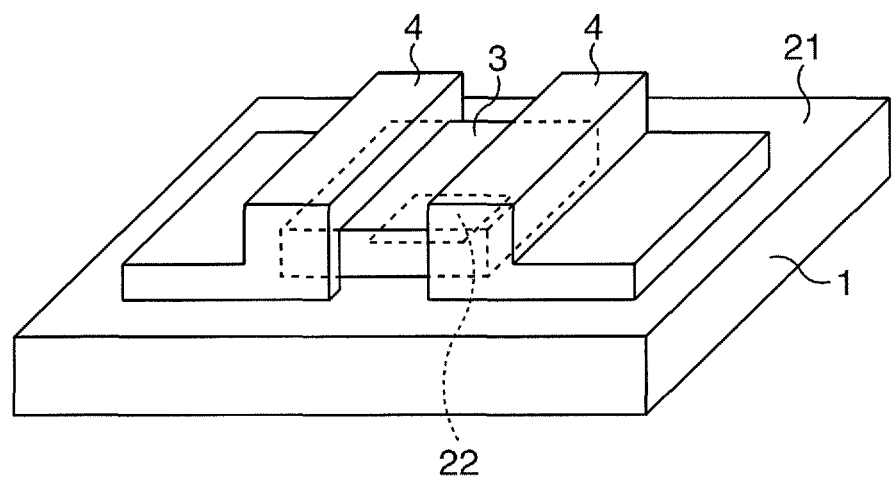
FIG. 6B, continued from FIG. 6A, is a perspective view illustrating the method for manufacturing the semiconductor device.

Thereafter, as illustrated in FIG. 5B and FIG. 6A, etching of a silicon oxide film 1b is performed so that a recessed portion 21 extending beneath an outer portion of the catalyst film 2 is formed in the silicon oxide film 1b. At this time, a protruding portion 22 is left in the silicon oxide film 1b under the center portion of the catalyst film 2, and contact between the upper surface of the protruding portion 22 and the lower surface of the catalyst film 2 is kept. Consequently, a gap is generated between the graphene 3 and the substrate 1, and further, partially, a gap is generated between the catalyst film 2 and the substrate 1. Etching of the silicon oxide film 1b may be performed with gas or solution of hydrogen fluoride (HF), for example.

Figure 5C:
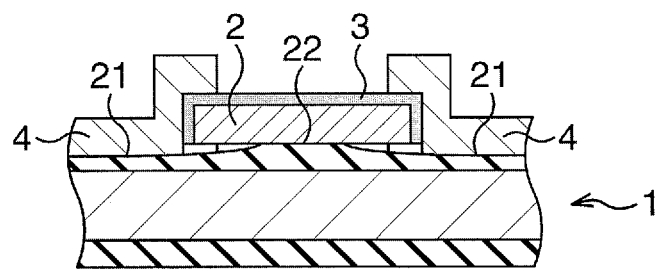
FIG. 5C, continued from FIG. 5B, is a cross-sectional view illustrating the method for manufacturing the semiconductor device.

Subsequently, as illustrated in FIG. 5C, two electrodes 4 which cover end portions of the graphene 3 are formed on the silicon oxide film 1b. Also after the electrodes 4 are formed, the gap exists between the graphene 3 and the substrate 1, and the gap partially exists between the catalyst film 2 and the substrate 1.

Figure 5D:
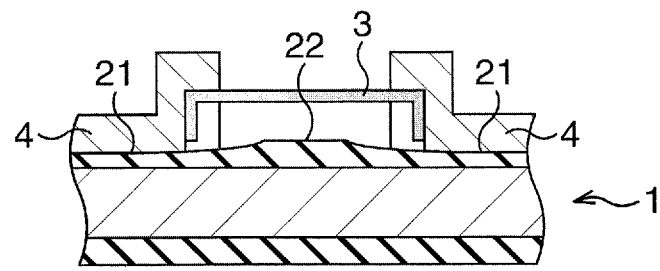
FIG. 5D, continued from FIG. 5C, is a cross-sectional view illustrating the method for manufacturing the semiconductor device.

Then, as illustrated in FIG. 5D and FIG. 6B, the catalyst film 2 is removed. Since both end portions of the graphene 3 are held by the electrodes 4 from sides, the graphene 3 is suspended between the electrodes 4.

Figure 5E:
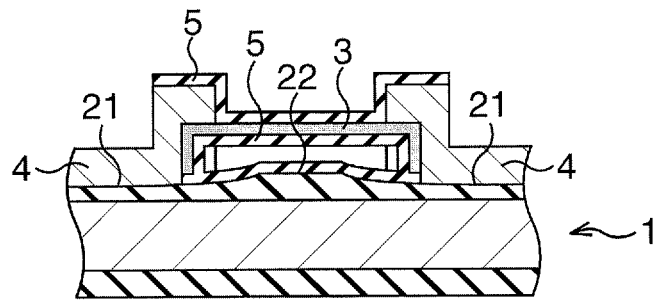
FIG. 5E, continued from FIG. 5D, is a cross-sectional view illustrating the method for manufacturing the semiconductor device.
Figure 5F:
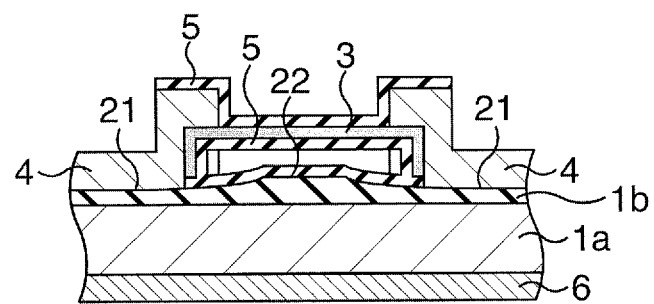
FIG. 5F, continued from FIG. 5E, is a cross-sectional view illustrating the method for manufacturing the semiconductor device.
Figure 5G:
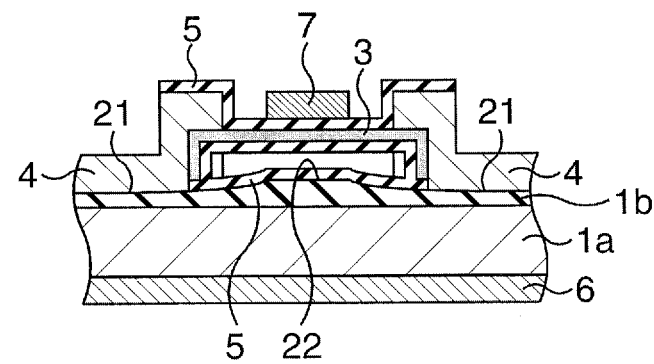
FIG. 5G, continued from FIG. 5F, is a cross-sectional view illustrating the method for manufacturing the semiconductor device.

Thereafter, as illustrated in FIG. 5E, an insulation film 5 which covers an exposed surface of the graphene 3 is formed. Subsequently, as illustrated in FIG. 5F, a silicon oxide film 1c is removed. Then, a back gate electrode 6 is formed on a rear surface of a silicon layer 1a. Then, as illustrated in FIG. 5G, a gate electrode 7 is formed on a part of the insulation film 5, the part covering an upper surface of the graphene 3.

According to the second embodiment, since the recessed portion 21 is formed by etching of the silicon oxide film 1b, even if the graphene 3 covers the side surface of the catalyst film 2, the catalyst film 2 can be easily removed without processing of the graphene 3 or the like. Therefore, the graphene 3 can be surely made to function as a channel.

Incidentally, a hafnium oxide film, an aluminum oxide film or the like may be used instead of the silicon oxide films 1a, 1b. When the hafnium oxide film is used, etching thereof may be performed with etching solution of hydrofluoric acid system, for example. When the aluminum oxide film is used, etching thereof may be performed with NaOH or hydrofluoric acid, for example.

Third Embodiment

Next, a third embodiment will be described. FIG. 7A to FIG. 7G are cross-sectional views illustrating a method for manufacturing a semiconductor device according to the third embodiment, in sequence of processes. Further, FIG. 8A to FIG. 8C are perspective views illustrating the method for manufacturing the semiconductor device according to the third embodiment, in sequence of processes.

Figure 7A:
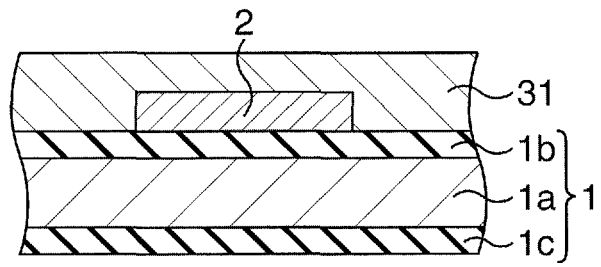
FIG. 7A is a cross-sectional view illustrating a method for manufacturing a semiconductor device according to a third embodiment.

In the third embodiment, first, as illustrated in FIG. 7A, similarly to in the referential example, a catalyst film 2 is formed on a substrate 1. Then, a protective film 31 which covers the catalyst film 2 is formed on the substrate 1. As a material of the protective film 31, it is preferable to use one satisfying the following five conditions, for example. (f) Not having a catalyst ability for formation of a graphene 3. (g) Having a melting point equal to or more than a temperature for forming the graphene 3. (h) Hard to be made into carbide. (i) Removable by dissolution or decomposition. (j) Having etching selectivity with the catalyst film 2.

Figure 7B:
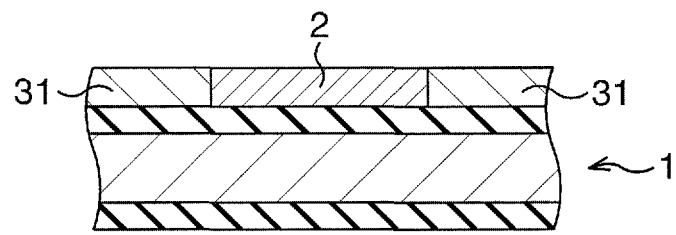
FIG. 7B, continued from FIG. 7A, is a cross-sectional view illustrating the method for manufacturing the semiconductor device.
Figure 8A:
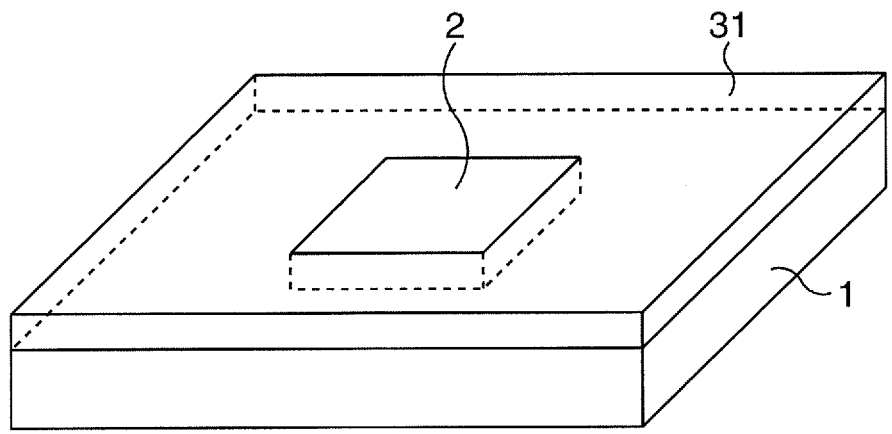
FIG. 8A is a perspective view illustrating the method for manufacturing the semiconductor device according to the third embodiment.

Thereafter, as illustrated in FIG. 7B and FIG. 8A, the protective film 31 is polished until an upper surface of the catalyst film 2 is exposed. It may be said that the protective film 31 before the polishing is a material film for the protective film 31.

Figure 7C:
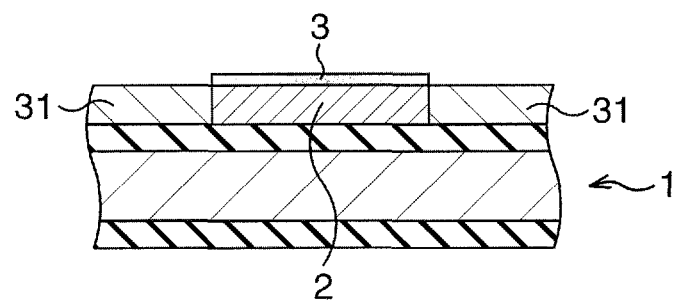
FIG. 7C, continued from FIG. 7B, is a cross-sectional view illustrating the method for manufacturing the semiconductor device.
Figure 8B:
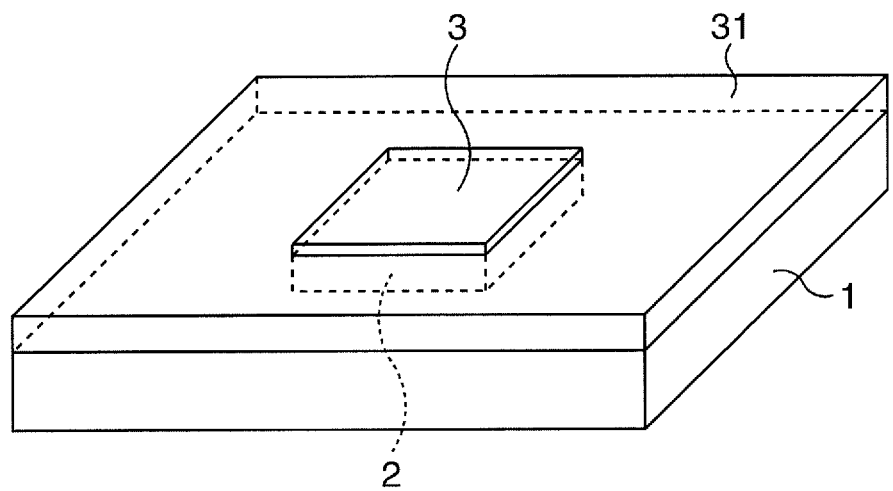
FIG. 8B, continued from FIG. 8A, is a perspective view illustrating the method for manufacturing the semiconductor device.
Figure 8C:
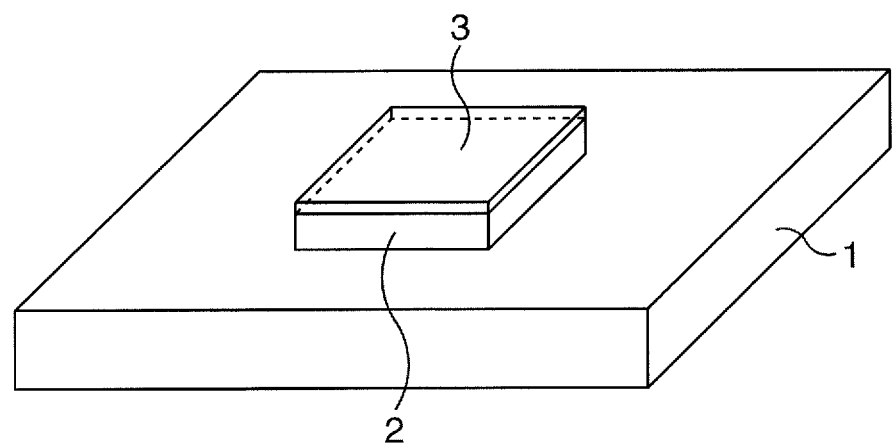
FIG. 8C, continued from FIG. 8B, is a perspective view illustrating the method for manufacturing the semiconductor device.

Subsequently, as illustrated in FIG. 7C and FIG. 8B, the graphene 3 is formed on the upper surface of the catalyst film 2. At this time, since a side surface of the catalyst film 2 is covered with the protective film 31, the graphene 3 is not grown on the side surface of the catalyst film 2.

Figure 7D:
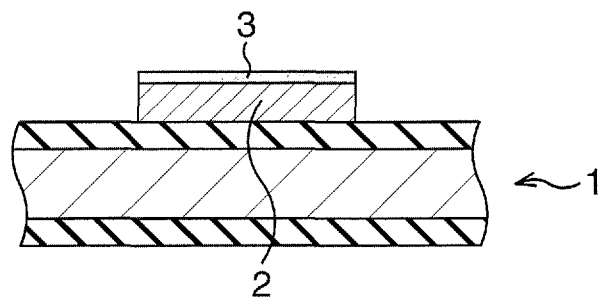
FIG. 7D, continued from FIG. 7C, is a cross-sectional view illustrating the method for manufacturing the semiconductor device.
Figure 7E:
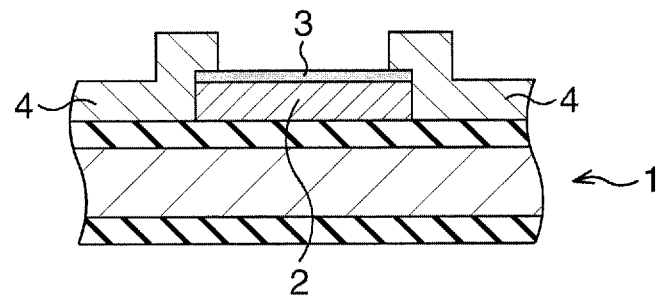
FIG. 7E, continued from FIG. 7D, is a cross-sectional view illustrating the method for manufacturing the semiconductor device.
Figure 7F:
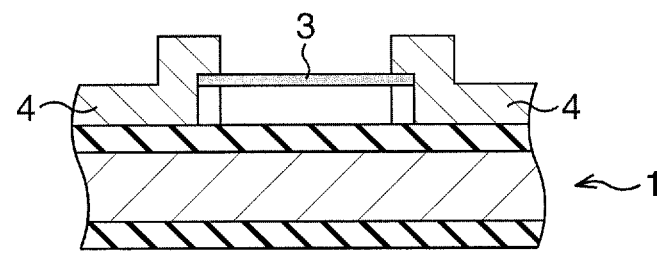
FIG. 7F, continued from FIG. 7E, is a cross-sectional view illustrating the method for manufacturing the semiconductor device.
Figure 7G:
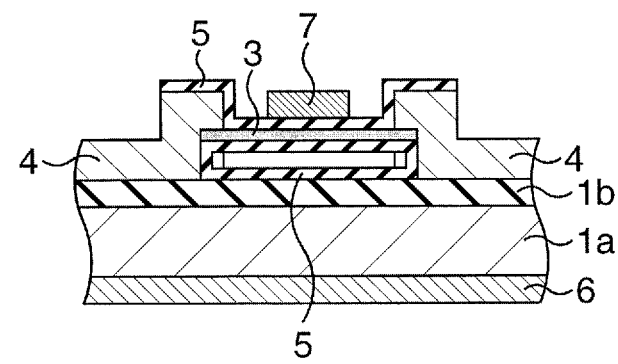
FIG. 7G, continued from FIG. 7F, is a cross-sectional view illustrating the method for manufacturing the semiconductor device.

Then, as illustrated in FIG. 7D and FIG. 8C, the protective film 31 is removed. Thereafter, as illustrated in FIG. 7E, two electrodes 4 which cover end portions of the graphene 3 are formed on a silicon oxide film 1b. Subsequently, as illustrated in FIG. 7F, the catalyst film 2 is removed. Since both end portions of the graphene 3 are held by the electrodes 4 from sides, the graphene 3 is suspended between the electrodes 4. Then, as illustrated in FIG. 7G, an insulation film 5 which covers an exposed surface of the graphene 3 is formed. Thereafter, a silicone oxide film 1c is removed. Subsequently, a back gate electrode 6 is formed on a rear surface of a silicon layer 1a. Then, a gate electrode 7 is formed on a part of the insulation film 5, the part covering an upper surface of the graphene 3.

According to the third embodiment, since the side surface of the catalyst film 2 is covered with the protective film 31 during forming the graphene 3, the graphene 3 does not come into contact with the substrate 1. Thus, the catalyst film 2 can be removed easily. Therefore, the graphene 3 can be surely made to function as a channel. Further, compared with the first embodiment and the second embodiment, a property of the graphene 3 is easy to be stabilized. This is because control of a thickness or the like of the graphene grown on the upper surface of the catalyst 2 is easier than that of the graphene grown on a side surface.

Here, a concrete example of the material of the protective film 31 will be described. As the material of the protective film 31, metals and compounds (oxides, nitrides, carbides, and the like) may be cited. As for the metal, it is preferable to use a transition metal with a high melting point, and Ti, Cr, W, Hf, Nb, and the like are favorable, for example. As for the compound, ZnO, MgO, $Al_2O_3$, $Si_3N_4$, and the like may be cited, for example. That is, the similar material to that of the base 11 may be used. Further, regarding the above-described conditions (i) and (j), it is preferable to consider a material of the catalyst film 2, too. The protective film 31 may be formed by a sputtering method, an electron beam evaporation method, a molecular beam epitaxy method, an ALD method, or the like, for example. Further, when a silicon oxide is used as the material of the protective film 31, the protective film 31 may be formed by applying SOG solution by a spin coat method, and annealing, for example.

Further, in the third embodiment, though the protective film 31 is formed so as to cover the upper surface and the side surface of the catalyst film 2, the protective film 31 may be formed so as to expose the upper surface of the catalyst film 2. In other words, the protective film 31 may be thinner than the catalyst film 2. In this case, the catalyst film 2 may be polished after forming the protective film 31 to make the thickness of the catalyst film 2 similar to the thickness of the protective film 31, for example. Further, if a part of the side surface of the catalyst film 2 is covered with the protective film 31 during forming the graphene 3, an effect may be obtained that the catalyst film 2 can be removed easily.

Fourth Embodiment

Next, a fourth embodiment will be described. FIG. 9A to FIG. 9E are cross-sectional views illustrating a method for manufacturing a semiconductor device according to the fourth embodiment, in sequence of processes. Further, FIG. 10A to FIG. 10E are perspective views illustrating the method for manufacturing the semiconductor device according to the fourth embodiment, in sequence of processes.

Figure 9A:
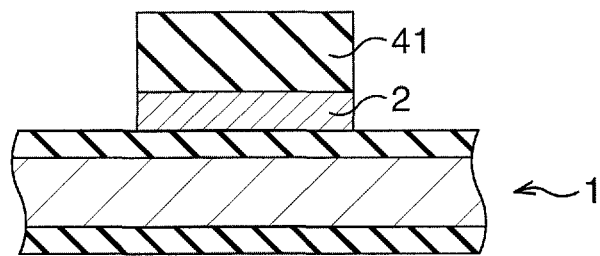
FIG. 9A is a cross-sectional view illustrating a method for manufacturing a semiconductor device according to a fourth embodiment.
Figure 10A:
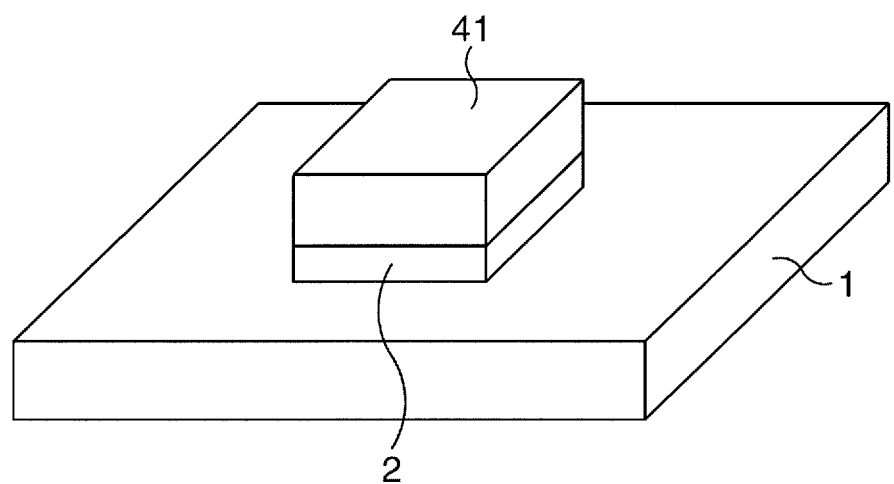
FIG. 10A is a perspective view illustrating the method for manufacturing the semiconductor device according to the fourth embodiment.

In the fourth embodiment, first, as illustrated in FIG. 9A and FIG. 10A, a catalyst film 2 and a protective film 41 are formed in this sequence on a substrate 1. The catalyst film 2 and the protective film 41 may be formed by a lift-off method using a single resist film, for example. A material of the protective film 41 (sacrifice film) will be described later.

Figure 9B:
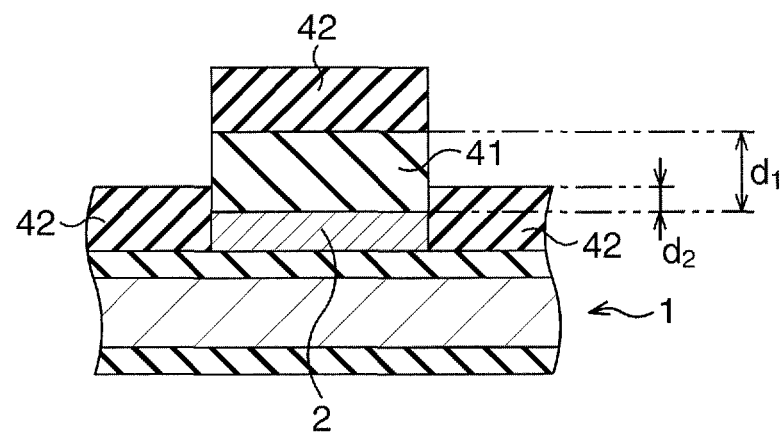
FIG. 9B, continued from FIG. 9A, is a cross-sectional view illustrating the method for manufacturing the semiconductor device.
Figure 10B:
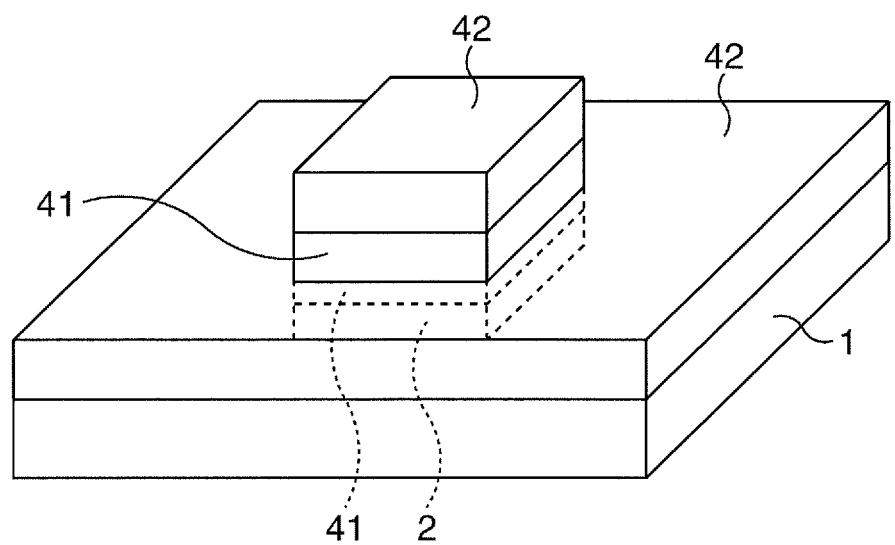
FIG. 10B, continued from FIG. 10A, is a perspective view illustrating the method for manufacturing the semiconductor device.

Then, as illustrated in FIG. 9B and FIG. 10B, a protective film 42 is formed on the protective film 41 and a silicon oxide film 1b so that at least a part of a side surface of the protective film 41 is exposed. At this time, a height $d_2$ of a front surface of the protective film 42 on the silicon oxide film 1b in reference to the interface between the catalyst film 2 and the protective film 41 is made smaller than a height $d_1$ of a front surface of the protective film 41 in reference to the interface between the catalyst film 2 and the protective film 41. As the material of the protective film 41, it is preferable to use one satisfying the following three conditions, for example. (k) Removable by dissolution or decomposition. (l) Having etching selectivity with the protective film 42. (m) Having etching selectivity with the catalyst film 2. Further, as a material of the protective film 42, it is preferable to use one satisfying the following five conditions, for example. (n) Not having a catalyst ability for formation of a graphene 3. (o) Having a melting point equal to or more than a temperature for forming the graphene 3. (p) Hard to be made into carbide. (q) Removable by dissolution or decomposition. (r) Having etching selectivity with the catalyst film 2.

Figure 9C:
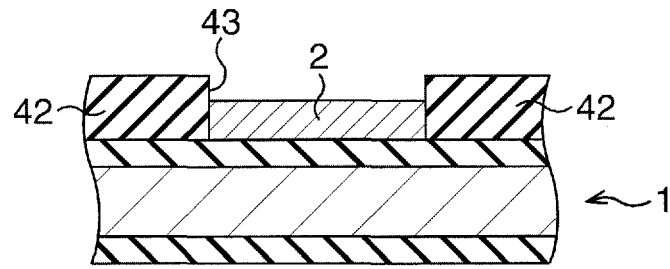
FIG. 9C, continued from FIG. 9B, is a cross-sectional view illustrating the method for manufacturing the semiconductor device.
Figure 10C:
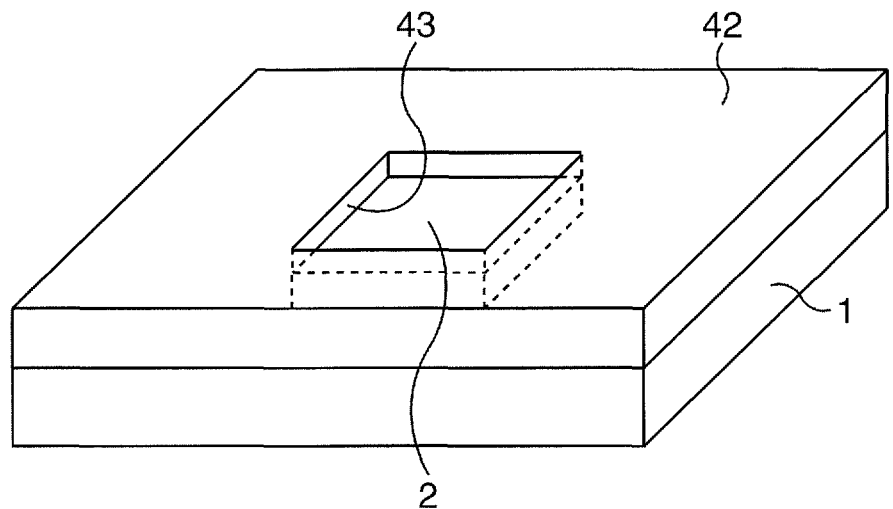
FIG. 10C, continued from FIG. 10B, is a perspective view illustrating the method for manufacturing the semiconductor device.

Thereafter, as illustrated in FIG. 9C and FIG. 10C, the protective film 41 is removed together with the protective film 42 positioned thereon, while the protective film 42 on the silicon oxide film 1b is made to remain. Consequently, an opening 43 through which the catalyst film 2 is exposed is formed in the remaining protective film 42. The whole of the protective film 42 before removing the protective film 41 (sacrifice film) may be a material film for the protective film 42.

Figure 9D:
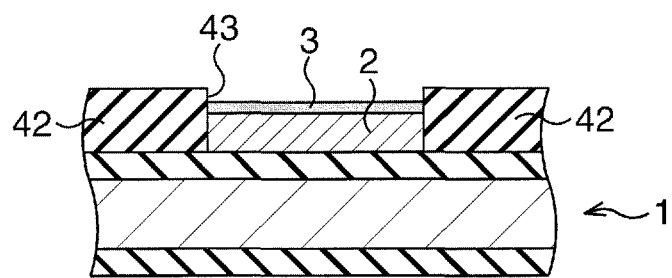
FIG. 9D, continued from FIG. 9C, is a cross-sectional view illustrating the method for manufacturing the semiconductor device.
Figure 10D:
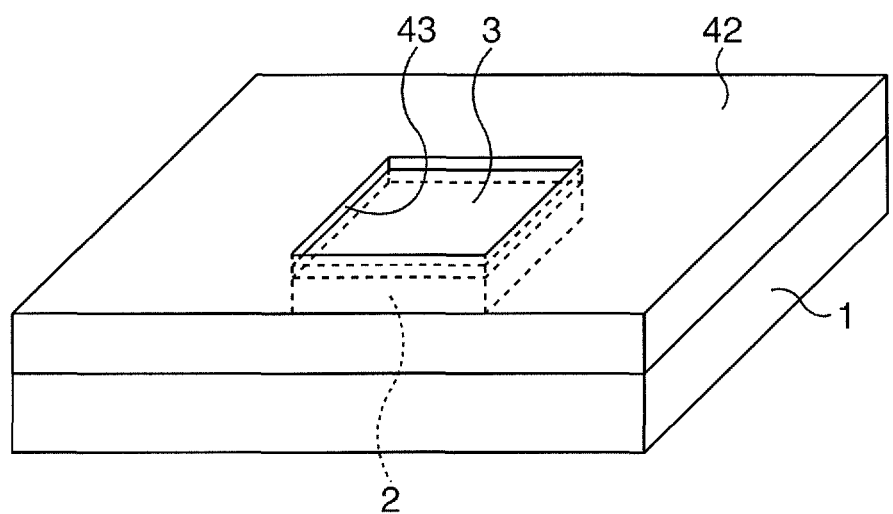
FIG. 10D, continued from FIG. 10C, is a perspective view illustrating the method for manufacturing the semiconductor device.

Subsequently, as illustrated in FIG. 9D and FIG. 10D, the graphene 3 is formed on the upper surface of the catalyst film 2 exposed through the opening 43. At this time, since the side surface of the catalyst film 2 is covered with the protective film 42, the graphene 3 is not grown on the side surface of the catalyst film 2.

Figure 9E:
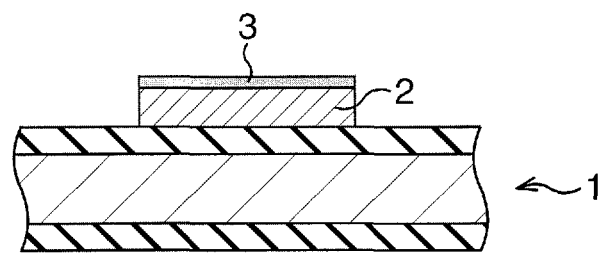
FIG. 9E, continued from FIG. 9D, is a cross-sectional view illustrating the method for manufacturing the semiconductor device.
Figure 10E:
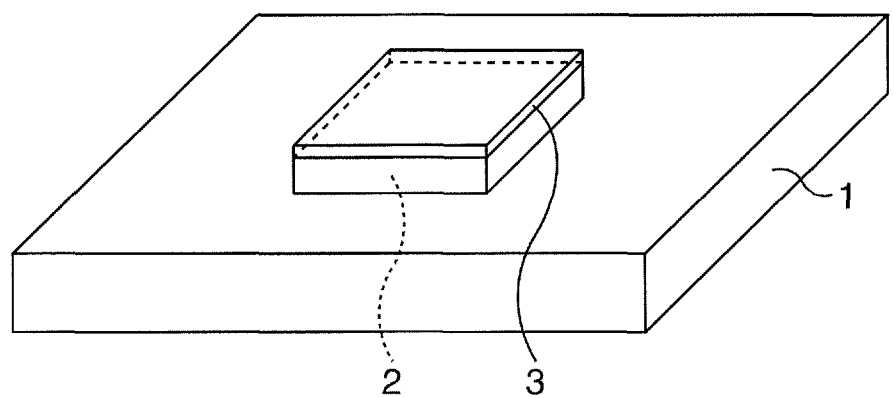
FIG. 10E, continued from FIG. 10D, is a perspective view illustrating the method for manufacturing the semiconductor device.

Then, as illustrated in FIG. 9E and FIG. 10E, the protective film 42 is removed. Consequently, a structure similar to that after removing the protective film 31 in the third embodiment may be obtained. Thereafter, similarly to in the third embodiment, processings from forming the electrodes 4 to forming the gate electrode 7 are performed.

According to the fourth embodiment, since the side surface of the catalyst film 2 is covered with the protective film 42 during forming the graphene 3, the graphene 3 does not come into contact with the substrate 1. Thus, the catalyst film 2 can be removed easily. Therefore, the graphene 3 can be surely made to function as a channel. Further, similarly to in the third embodiment, a property of the graphene 3 is easy to be stabilized compared with the first embodiment and the second embodiment.

Incidentally, as the materials of the protective films 41, 42, metals and compounds (oxides, nitrides, carbides, etc.) may be cited. For example, ZnO or MgO, which is soluble to hydrochloric acid, may be used as the material of the protective film 41 and $SiO_2$, which is insoluble to hydrochloric acid and soluble to hydrofluoric acid, may be used as the material of the protective film 42. The protective films 41 and 42 may be formed by a sputtering method, an electron beam deposition method, a molecular beam epitaxy method, an ALD method, or the like, for example. Further, photo resist solution may be also used as the protective film 41.

Fifth Embodiment

Next, a fifth embodiment will be described. FIG. 11A to FIG. 11F are cross-sectional views illustrating a method for manufacturing a semiconductor device according to the fifth embodiment, in sequence of processes. Further, FIG. 12A to FIG. 12C are perspective views illustrating the method for manufacturing the semiconductor device according to the fifth embodiment, in sequence of processes.

Figure 11A:
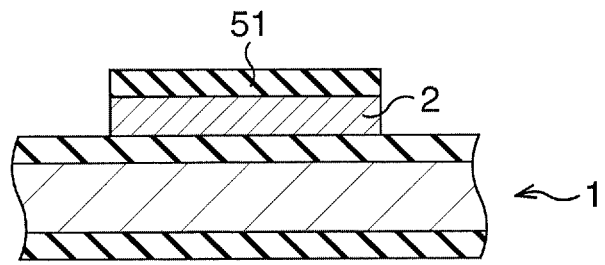
FIG. 11A is a cross-sectional view illustrating a method for manufacturing a semiconductor device according to a fifth embodiment.
Figure 12A:
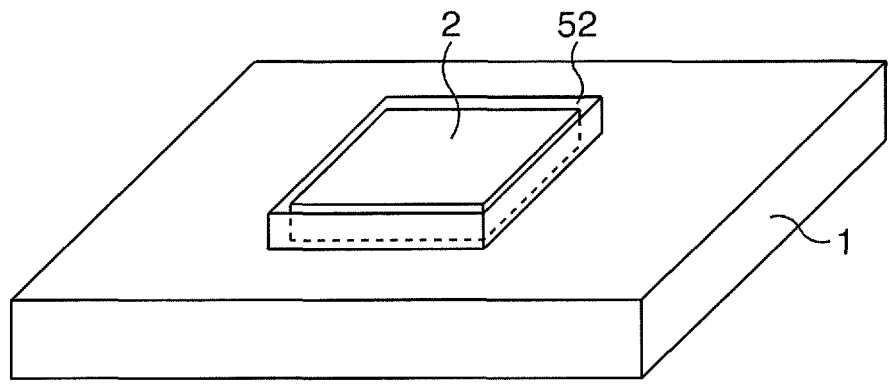
FIG. 12A is a perspective view illustrating the method for manufacturing the semiconductor device according to the fifth embodiment.
Figure 12B:
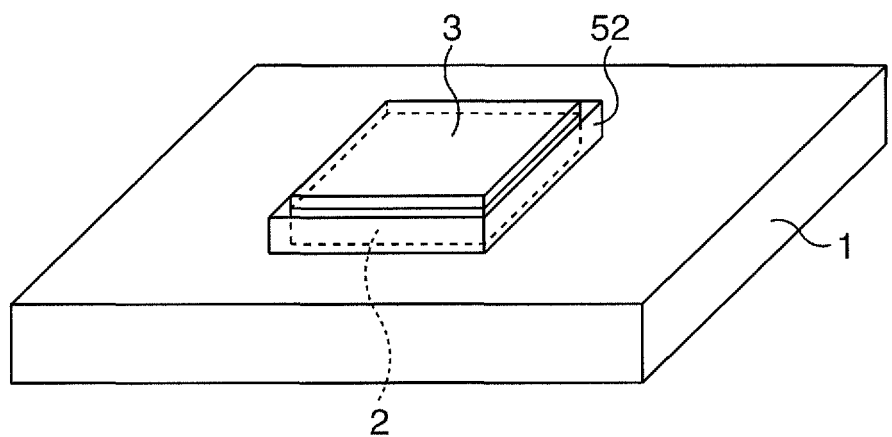
FIG. 12B, continued from FIG. 12A, is a perspective view illustrating the method for manufacturing the semiconductor device.
Figure 12C:
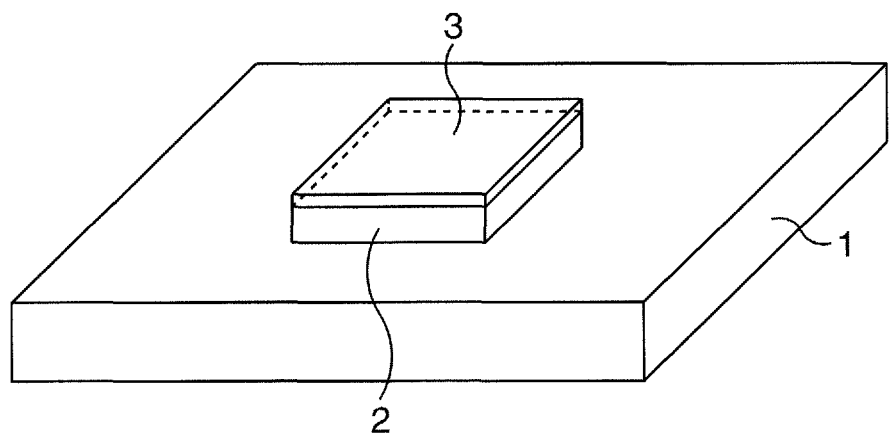
FIG. 12C, continued from FIG. 12B, is a perspective view illustrating the method for manufacturing the semiconductor device.

In the fifth embodiment, first, as illustrated in FIG. 11A, a catalyst film 2 and a protective film 51 are formed in this sequence on a substrate 1. The catalyst film 2 and the protective film 51 may be formed by a lift-off method using a single resist film, for example. A material of the protective film 51 (sacrifice film) will be described later.

Figure 11B:
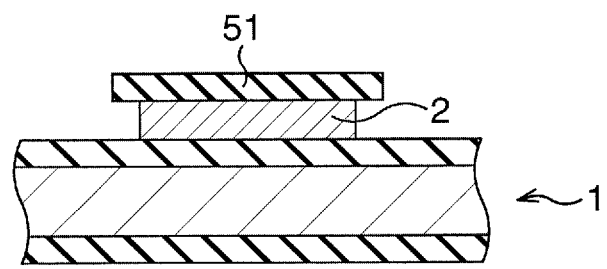
FIG. 11B, continued from FIG. 11A, is a cross-sectional view illustrating the method for manufacturing the semiconductor device.

Then, as illustrated in FIG. 11B, while the protective film 51 is made to remain, the catalyst film 2 is etched so that a side surface of the catalyst film 2 are made to recede toward an inner side of a side surface of the protective film 51. That is, the catalyst film 2 is reduced in plan view. Consequently, the protective film 51 becomes something like an eave to the catalyst film 2.

Figure 11C:
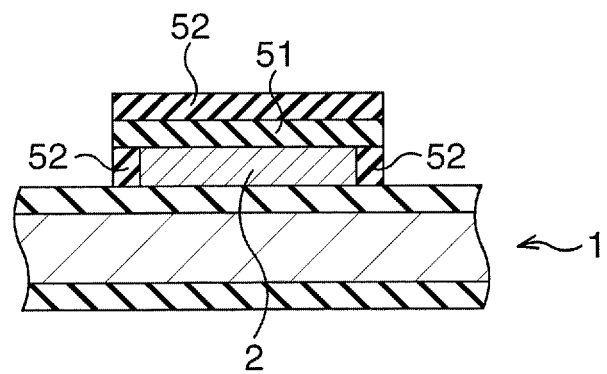
FIG. 11C, continued from FIG. 11B, is a cross-sectional view illustrating the method for manufacturing the semiconductor device.

Thereafter, as illustrated in FIG. 11C, a protective film 52 is formed on an upper surface of the protective film 51 and on a side surface of the catalyst film 2 so that at least a part of a side surface of the protective film 51 is exposed. The protective film 52 may be formed by deposition from a direction inclined from a direction perpendicular to a front surface of the substrate 1, for example. As a material of the protective film 51, it is preferable to use one satisfying the following three conditions, for example. (s) Removable by dissolution or decomposition. (t) Having etching selectivity with the protective film 52. (u) Having an etching selectivity with the catalyst film 2. Further, as a material of the protective film 52, it is possible to use one satisfying the following five conditions, for example. (v) Not having a catalyst ability for formation of a graphene 3. (w) Having a melting point equal to or more than a temperature for forming the graphene 3. (x) Hard to be made into carbide. (y) Removable by dissolution or decomposition. (z) Having etching selectivity with the catalyst film 2.

Figure 11D:
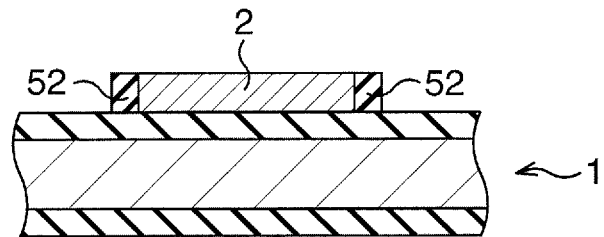
FIG. 11D, continued from FIG. 11C, is a cross-sectional view illustrating the method for manufacturing the semiconductor device.

Subsequently, as illustrated in FIG. 11D and FIG. 12A, the protective film 51 is removed together with the protective film 52 positioned thereon, while the protective film 52 on the side surface of the catalyst film 2 is made to remain. The whole of the protective film 52 before removing the protective film 51 (sacrifice film) may be said to be a material film for the protective film 52.

Figure 11E:
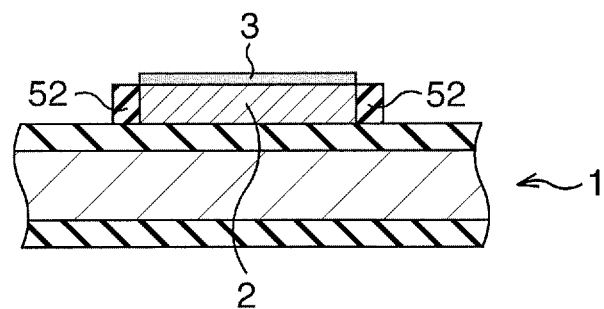
FIG. 11E, continued from FIG. 11D, is a cross-sectional view illustrating the method for manufacturing the semiconductor device.

Then, as illustrated in FIG. 11E and FIG. 12B, the graphene 3 is formed on an upper surface of the catalyst film 2. At this time, since the side surface of the catalyst film 2 is covered with the protective film 52, the graphene 3 is not grown on the side surface of the catalyst film 2.

Figure 11F:
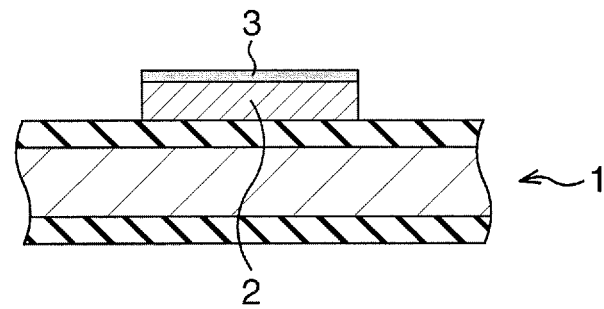
FIG. 11F, continued from FIG. 11E, is a cross-sectional view illustrating the method for manufacturing the semiconductor device.

Thereafter, as illustrated in FIG. 11F and FIG. 12C, the protective film 52 is removed. Consequently, a structure similar to that after removing the protective film 31 in the third embodiment may be obtained. Thereafter, similarly to in the third embodiment, processings from forming the electrodes 4 to forming the gate electrode 7 are performed.

According to the fifth embodiment, since the side surface of the catalyst film 2 is covered with the protective film 52 during forming the graphene 3, the graphene 3 does not come into contact with the substrate 1. Thus, the catalyst film 2 can be removed easily. Therefore, the graphene 3 can be surely made to function as a channel. Further, similarly to in the third embodiment, a property of the graphene 3 is easy to be stabilized compared with the first embodiment and the second embodiment.

Incidentally, as the materials of the protective films 51, 52, metals and compounds (oxides, nitrides, carbides, and the like) may be cited. For example, when Fe is used as the material of the catalyst film 2, photo resist solution which is soluble to organic solvent such as acetone may be used as the material of the protective film 51, and ZnO, which is soluble to NaOH aqueous solution, may be used as the material of the protective film 52. The protective films 51 and 52 may be formed by a sputtering method, an electron beam deposition method, a molecular beam epitaxy method, an ALD method, or the like, for example.

Further, usage of the semiconductor device is not limited to particular one, and the semiconductor device may be used as a high-power amplifier for a wireless base station, a high-power amplifier for a mobile phone base station, a semiconductor element for a server, a semiconductor element for a personal computer, an on-vehicle integral circuit (IC), and a transistor for driving a motor of an electric vehicle, for example.

The present invention may be suitable to an industry related to a semiconductor device which includes graphene and a method for manufacturing the same.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method for manufacturing a semiconductor device, comprising:
    forming a catalyst film over a substrate;
    growing a graphene on the catalyst film;
    forming a gap through which a lower surface of the catalyst film is exposed; and
    removing the catalyst film through the gap.

2. The method for manufacturing the semiconductor device according to claim 1, further comprising forming a base over the substrate, before the forming the catalyst film,
    wherein the catalyst film is formed on the base, and
    the forming the gap comprises removing the base.

3. The method for manufacturing the semiconductor device according to claim 2, wherein, as the base, one which does not function as a catalyst for a graphene is formed.

4. The method for manufacturing the semiconductor device according to claim 1, wherein the forming the gap comprising etching a surface of the substrate to form a recessed portion extending to a lower part of the catalyst film.

5. The method for manufacturing the semiconductor device according to claim 1, further comprising forming two electrodes which cover end portions of the graphene, before the removing the catalyst film.

6. The method for manufacturing the semiconductor device according to claim 5, further comprising, after the removing the catalyst film:
    forming a gate insulation film which covers the graphene between the two electrodes; and
    forming a gate electrode so that the insulation film is sandwiched between the graphene and the gate electrode.

7. The method for manufacturing the semiconductor device according to claim 1, wherein the substrate comprises an insulation film formed on a surface on a side of which the catalyst film is to be formed.

8. A method for manufacturing a semiconductor device, comprising:
    forming a catalyst film over a substrate;
    forming a protective film through which an upper surface of the catalyst film is exposed; and
    growing a graphene on the upper surface of the catalyst film.

9. A method for growing a graphene, comprising:
    forming a catalyst film over a substrate;
    growing the graphene on the catalyst film;
    forming a gap through which a lower surface of the catalyst film is exposed; and
    removing the catalyst film through the gap.

* * * * *

UNITED STATES PATENT AND TRADEMARK OFFICE
CERTIFICATE OF CORRECTION

PATENT NO. : 8,642,410 B2
APPLICATION NO. : 13/756815
DATED : February 4, 2014
INVENTOR(S) : Kenjiro Hayashi and Shintaro Sato It is certified that error appears in the above-identified patent and that said Letters Patent is hereby corrected as shown below:

In the Claims

Column 14, Claim 8 should read as follows:

8. A method for manufacturing a semiconductor device, comprising:
 forming a catalyst film over a substrate;
 forming a protective film through which an upper surface of the catalyst film is exposed; and
 growing a graphene on the upper surface of the catalyst film.

Signed and Sealed this
Twenty-fifth Day of November, 2014

Michelle K. Lee
*Deputy Director of the United States Patent and Trademark Office*

UNITED STATES PATENT AND TRADEMARK OFFICE
CERTIFICATE OF CORRECTION

PATENT NO.        : 8,642,410 B2                              Page 1 of 1
APPLICATION NO.   : 13/756815
DATED             : February 4, 2014
INVENTOR(S)       : Kenjiro Hayashi and Shintaro Sato It is certified that error appears in the above-identified patent and that said Letters Patent is hereby corrected as shown below:

In the Claims

Column 14, lines 18-24, Claim 8 should read as follows:

8. A method for manufacturing a semiconductor device, comprising:
        forming a catalyst film over a substrate;
        forming a protective film through which an upper surface of the catalyst film is exposed; and
        growing a graphene on the upper surface of the catalyst film.

This certificate supersedes the Certificate of Correction issued November 25, 2014.

Signed and Sealed this
Twenty-third Day of December, 2014

Michelle K. Lee
*Deputy Director of the United States Patent and Trademark Office*